US012588342B2

(12) United States Patent
Liu

(10) Patent No.: US 12,588,342 B2
(45) Date of Patent: Mar. 24, 2026

(54) LIGHT-EMITTING PLATE AND DISPLAY DEVICE

(71) Applicant: TCL China Star Optoelectronics Technology Co., Ltd., Shenzhen (CN)

(72) Inventor: Jing Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 352 days.

(21) Appl. No.: 18/335,354

(22) Filed: Jun. 15, 2023

(65) Prior Publication Data

US 2024/0332471 A1      Oct. 3, 2024

(30) Foreign Application Priority Data

Mar. 28, 2023    (CN) ......................... 202310350913.5

(51) Int. Cl.
| | |
|---|---|
| *H10H 20/857* | (2025.01) |
| *G02F 1/1335* | (2006.01) |
| *G02F 1/13357* | (2006.01) |
| *G02F 1/1345* | (2006.01) |
| *H01L 25/075* | (2006.01) |
| *H10H 20/01* | (2025.01) |

(52) U.S. Cl.
CPC ..... *H10H 20/857* (2025.01); *G02F 1/133603* (2013.01)

(58) Field of Classification Search
CPC .............. H10H 20/857; H10H 20/0364; G02F 1/133603; G02F 1/133612; G02F 1/134452; G02F 1/134458; H01L 25/0753
See application file for complete search history.

(56) References Cited

FOREIGN PATENT DOCUMENTS

CN          217587821 U  *  10/2022

* cited by examiner

*Primary Examiner* — Antonio B Crite
(74) *Attorney, Agent, or Firm* — Nathan & Associates Patent Agents Ltd.; Menachem Nathan

(57) ABSTRACT

Light-emitting plates and display devices are provided by the present application. The light-emitting plate includes a substrate, a driving layer disposed on the substrate and including a metal wire, a pad disposed on a side of the driving layer facing away from the substrate and connected to the driving layer, a light-emitting element disposed on a side of the pad facing away from the substrate and connected to the pad; and a solder resist layer disposed on the side of the driving layer facing away from the substrate. The solder resist layer is defined with an opening configured to expose the light-emitting element. One or more vias are defined in the metal wire and the solder resist layer extends into the one or more vias.

20 Claims, 6 Drawing Sheets

21 21b

W

LIGHT-EMITTING PLATE AND DISPLAY DEVICE

CROSS-REFERENCE TO RELATED APPLICATIONS

This application claims priority to Chinese Patent Application No. 202310350913.5, filed on Mar. 28, 2023. The disclosures of the aforementioned application is incorporated herein by reference in its entirety.

TECHNICAL FIELD

The present application relates to a technical field of display, and in particular to light-emitting plates and display devices.

BACKGROUND

A Mini-LED display device includes a substrate and a plurality of metal wires covering over 40% of surface area of the substrate. A solder resist layer is provided on the metal wires of the top layer to prevent the metal wires from corrosion and enhance reflection to improve a light-emitting efficiency of the display device.

The solder resist layer has a great adhesion to the substrate, but has a poor adhesion to the metal wires. Therefore, it is easy for the solder resist layer to peel off due to thermal expansion in the thermal test of reliability tests.

SUMMARY

Light-emitting plates and display devices are provided according to the present application to solve the problem of peeling of the solder resist layer due to the poor adhesion between the solder resist layer and the metal wires.

A light-emitting plate, including: a substrate; a driving layer disposed on the substrate and including a metal wire; a pad disposed on a side of the driving layer facing away from the substrate and connected to the driving layer; a light-emitting element disposed on a side of the pad facing away from the substrate and connected to the pad; and a solder resist layer disposed on the side of the driving layer facing away from the substrate, wherein the solder resist layer is defined with an opening configured to expose the light-emitting element; wherein one or more vias are defined in the metal wire and the solder resist layer extends into the one or more vias.

Optionally, a ratio of a sum of cross-section area of the one or more vias in the metal wire perpendicular to a thickness direction of the metal wire to a cross-section area of the metal wire perpendicular to the thickness direction of the metal wire is greater than or equal to 30%.

Optionally, a greatest length of one of the one or more vias in an extending direction of the metal wire is greater than or equal to a greatest length of the one of the one or more vias in a direction perpendicular to the extending direction of the metal wire.

Optionally, a cross-section of one of the one or more vias perpendicular to a thickness direction of the metal wire is a rectangle, the cross-section of the one of the one or more vias includes a first side parallel to an extension direction of the metal wire and a second side perpendicular to the first side, and a length of the first side is greater than or equal to a length of the second side.

Optionally, a cross-section of one of the one or more vias perpendicular to a thickness direction of the metal wire is a diamond, the diamond includes a first diagonal parallel to an extension direction of the metal wire and a second diagonal perpendicular to the first diagonal, a length of the first diagonal is greater than the second diagonal.

Optionally, a cross-section of one of the one or more vias perpendicular to a thickness direction of the metal wire is a rectangle, and an angle between any side of the cross-section of the one of the one or more vias and an extending direction of the metal wire is greater than 0 degree and less than 90 degrees.

Optionally, a cross-section of one of the one or more vias perpendicular to a thickness direction of the metal wire is a quadrilateral, and a diagonal of the quadrilateral is parallel to an extending direction of the metal wire.

Optionally, a width of a first portion of the metal wire defined with the one or more vias is greater than a width of a second portion of the metal wire without vias.

Optionally, the width of the second portion of the metal wire without vias is equal to an active width calculated by subtracting a sum of the widths of the one or more vias from the width of the first portion of the metal wire defined with the one of the one or more vias.

Optionally, a cross-section of one of the one or more vias perpendicular to a thickness direction of the metal wire is selected from one of triangle, circle, rectangle, or diamond.

Optionally, the light-emitting plate is a display panel, and the solder resist layer includes black ink; or the light-emitting plate is a backlight plate, and the solder resist layer includes white ink.

Optionally, one of the one or more vias is defined as a through-hole, the substrate is exposed from the through-hole, and the solder resist layer is connected to the substrate.

A display device, including anyone of the above-mentioned light-emitting plate, the light-emitting plate is a backlight plate, and the display device further includes a liquid crystal display panel.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show only some embodiments of this application, and a person of ordinary skill in the art may still derive other accompanying drawings from these accompanying drawings without creative efforts.

DETAILED DESCRIPTION OF THE EMBODIMENT

Figure 1:
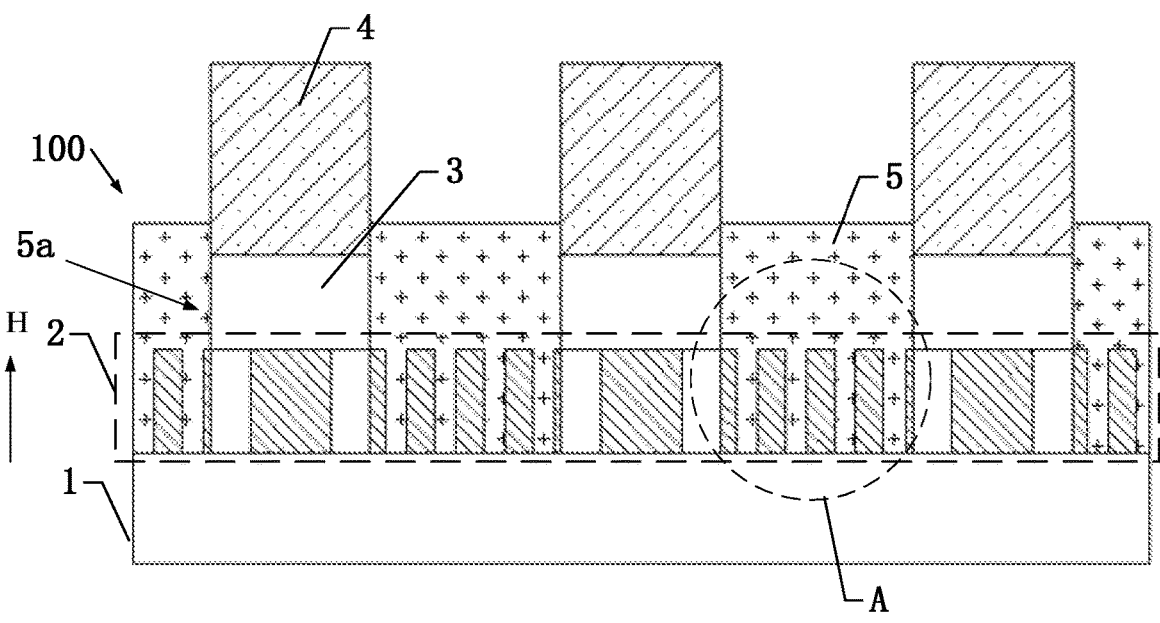
FIG. 1 is a schematic diagram of a structure of a light-emitting plate according to embodiment 1 of the present application.

Preferred embodiments of the present invention will be described in detail below with reference to the accompanying drawings, which will fully introduce the technical content of the present invention to those skilled in the art, and prove that the invention can be implemented by examples. The technical content of the present application is made clearer, making it easier for those skilled in the art to understand how to implement the present invention. However, the invention can be embodied in many different forms of embodiment. The protection scope of the present invention is not limited to the embodiments mentioned herein. The following description of the embodiments is not intended to limit the scope of the invention.

The directional terms mentioned in the present invention, such as "upper", "lower", "before", "after", "left", "right", "inside", "outside", "side", etc., are only directions in the drawings. The directional terms used herein are used to explain and describe the present invention and are not intended to limit the scope of the present invention.

In the drawings, components having the same structure are denoted by the same reference numerals. Components that are structurally or functionally similar are represented by like numerals. Moreover, dimensions and thickness of each component shown in the drawings are arbitrarily shown for ease of understanding and description. The invention does not limit the size and thickness of each component.

Embodiment 1

Figure 2:
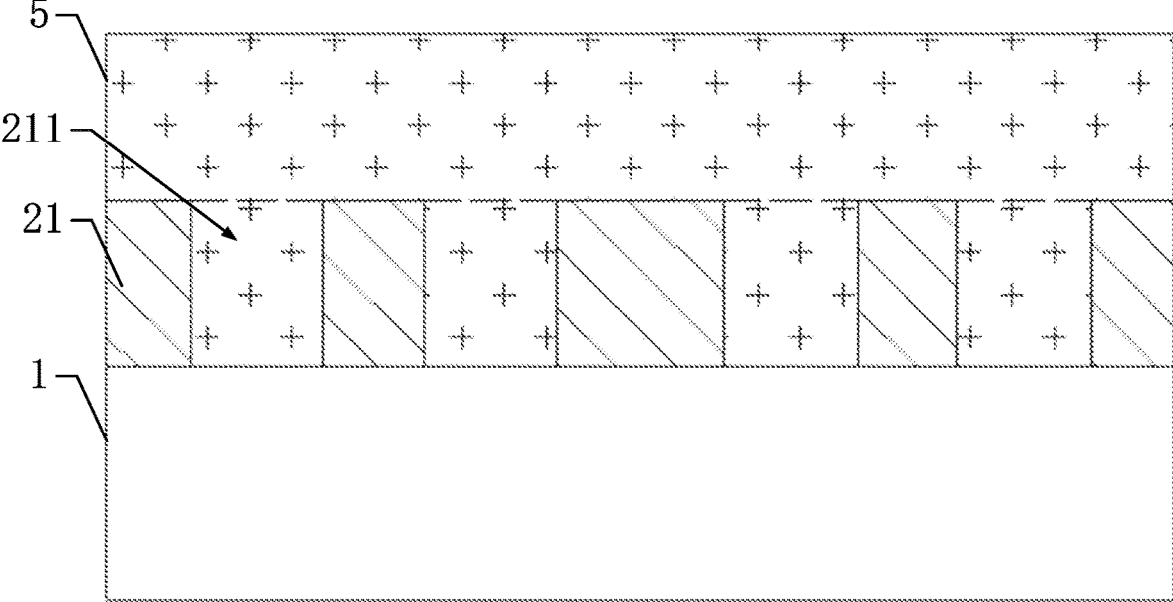
FIG. 2 is a partially enlarged schematic diagram of part A in FIG. 1.

As shown in FIG. 1 and FIG. 2, one embodiment of the present application provides a light-emitting plate 100. The light-emitting plate 100 includes a substrate 1, a driving layer 2, a plurality of pads 3, a plurality of light-emitting elements 4 and a solder resist layer 5.

A material of the substrate 1 is selected from one or more of glass, polyimide, polycarbonate, polyethylene terephthalate and polyethylene naphthalate. In the embodiment, the material of substrate 1 is glass.

The driving layer 2 is disposed on the substrate 1 and includes a plurality of metal wires 21 spaced from each other. A material of the driving layer 2 includes one or more of copper, molybdenum, aluminum, and titanium. In the embodiment, materials of the metal wires are copper.

The pads 3 are disposed on a side of the driving layer 2 facing away from the substrate 1 and spaced from each other. And the pads 3 are electrical connected to the driving layer 2.

The light-emitting elements 4 are disposed on a side of the pads 3 facing away from the substrate 1. And the light-emitting elements 4 are connected to the pads 3 in a one-to-one correspondence. In the embodiment, the light-emitting elements 4 are Mini-LEDs, and in other embodiments, the light-emitting elements 4 may be Micro-LEDs.

The solder resist layer 5 covers on a surface of the driving layer 2 facing away from the substrate 1. The solder resist layer 5 are provided with a plurality of openings 5a each corresponding to one of the light-emitting elements 4 to exposed the light-emitting elements 4, so as to let light emitted by the light-emitting elements 4 out.

In the embodiment, the light-emitting plate 100 is a backlight plate. A material of the solder resist layer 5 is white ink. The solder resist layer 5 has a high reflectivity, which can improve light extraction efficiency of the light emitting plate 100 and display brightness of the display device.

As shown in FIG. 1 and FIG. 2, in the driving layer 2, one or more vias 211 are defined in one or more metal wires 21 covered by the solder resist layer 5. Therefore, the solder resist layer 5 may extends into the one or more vias 211 and connected to the substrate 1, which may improve the adhesion between the solder resist layer 5 and the substrate 1, and solve the problem of peeling of the solder resist layer 5 due to the poor adhesion between the solder resist layer 5 and the substrate 1.

Figure 3:
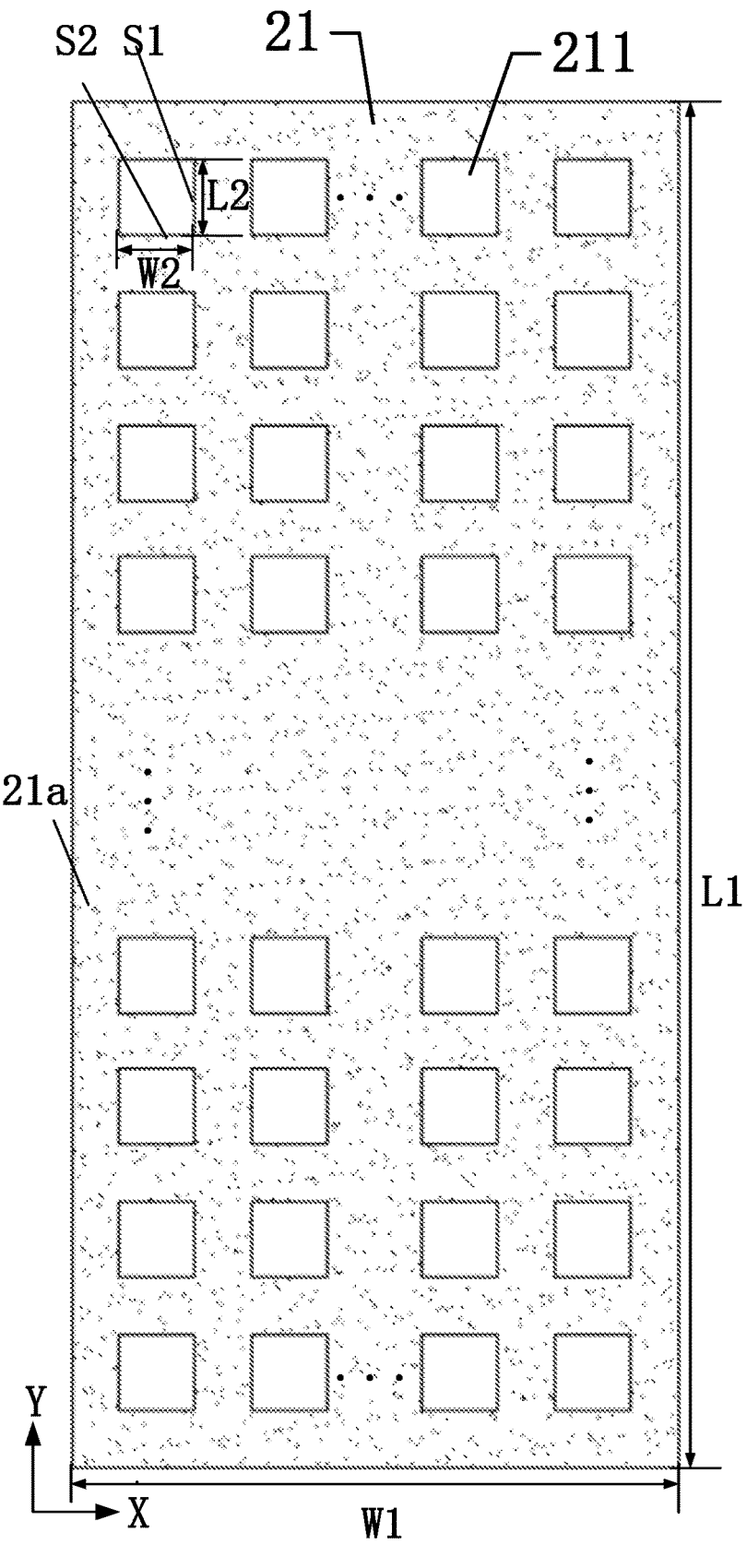
FIG. 3 is a planar schematic diagram of the metal wires of the embodiment 1.

As shown in FIGS. 1 to 3, cross-sections of the vias 211 perpendicular to a thickness direction H of the metal wires 21 may be dependently selected from one of triangle, circle, rectangle, or diamond. In the embodiment, cross-sections of the vias 211 perpendicular to the thickness direction H of the metal wires 21 are triangles, specifically, squares.

As shown in FIG. 3, a ratio of a sum of cross-section area of the one or more vias 211 in anyone of the metal wires 21 perpendicular to the thickness direction H of the metal wire 21 to a cross-section area of the metal wire 21 perpendicular to the thickness direction H of the metal wire 21 is greater than or equal to 30%. In the embodiment, the ratio of the sum of cross-section area of the one or more vias 211 in anyone of the metal wire 21 perpendicular to the thickness direction H of the metal wire 21 to the cross-section area of the metal wire 21 perpendicular to the thickness direction H of the metal wire 21 is equal to 50%. Specifically, the area of the cross-section area of the metal wire 21 perpendicular to the thickness direction H of the metal wire 21 is $L_1*W_1$, the sum of cross-section area of the one or more vias 211 in the metal wire 21 perpendicular to the thickness direction H of the metal wire 21 is $N*L_2*W_2$, in which N is a number of the one or more vias 211 defined in the metal wire 21. That is, $N*L_2*W_2/(L_1*W_1)=50\%$.

In some embodiments, the cross-section of one of the one or more vias 211 perpendicular to the thickness direction H of the metal wire 21 is a rectangle, the cross-section of one of the one or more via 211 includes a first side S1 parallel to an extension direction Y of the metal wire 21 and a second side S2 perpendicular to the extension direction Y of the metal wire 21(which is parallel to a direction X). A length $L_2$ of the first side S1 maybe greater than or equal to a length $W_2$ of the second side S2. In the embodiment, the cross-section of one of the one or more via 211 perpendicular to the thickness direction H of the metal wire 21 is a square, that is to say, the length $L_2$ of the first side S1 is equal to the length $W_2$ of the second side S2.

In some embodiment, the length $L_2$ of the first side S1 maybe greater than the length $W_2$ of the second side S2. When a cross-section area of the via 211 perpendicular to the thickness direction H of the metal wire 21 remains unchanged as $L_2*W_2$, the greater the length $L_2$ is, the less the length $W_2$ is, which can reduce the width $W_1$ of the metal wire 21, and increase design margin (which means the metal wires 21 can be more flexibly arranged in a limited space), therefore, a boarder width is decreased and narrow bezel is fulfilled.

Figure 4:
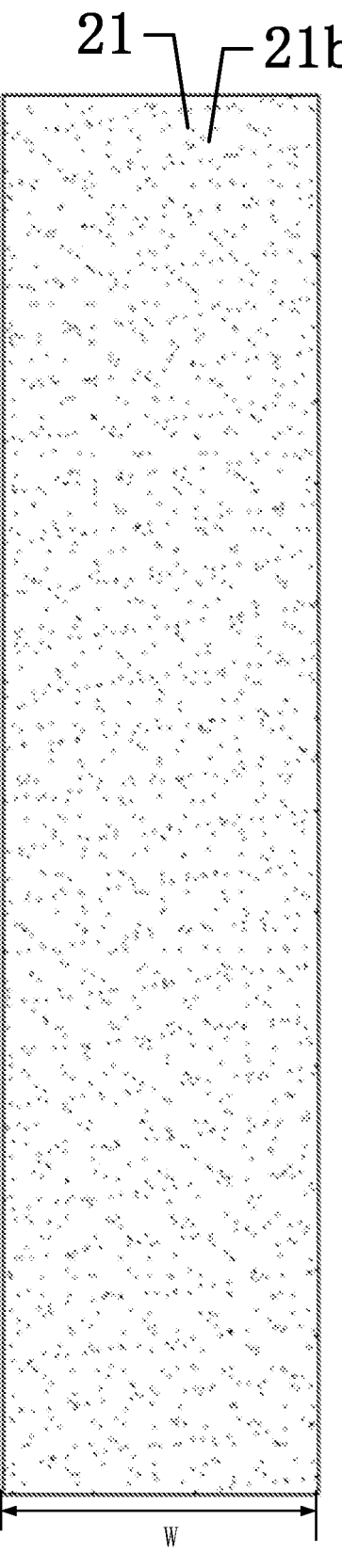
FIG. 4 is a planar schematic diagram of a second portion of the metal wire without vias.

As shown in FIGS. 3 and 4, a width $W_1$ of a first portion 21a of the metal wire 21 defined with the one or more vias 211 is greater than a width W of a second portion 21b of the metal wire 21 without vias.

Specifically, the width W of the second portion 21b of the metal wire 21 without vias is equal to an active width calculated by subtracting a sum of the widths of the one or more vias from the width $W_1$ of the first portion 21a of the metal wire 21 defined with the one of the one or more vias 211 (which is $W_1-M*W_2$). In which, M is a number of the one or more vias 211 arranged in a direction perpendicular to the extending direction Y of the metal wire 21(which is the direction X). Therefore, an impedance of the first portion 21a of the metal wire 21 defined with the one or more vias 211 and an impedance of the second portion 21b of the metal wire 21 without vias are equal.

In the embodiment, the ratio of the sum of cross-section area of the one or more vias 211 in anyone of the metal wire 21 perpendicular to the thickness direction H of the metal wire 21 to the cross-section area of the metal wire 21 perpendicular to the thickness direction H of the metal wire 21 is equal to 50%. Therefore, the width $W_1$ of the first portion 21*a* of the metal wire 21 defined with the one or more vias 211 is twice as the width W of the second portion 21*b* of the metal wire 21 without vias.

The embodiments also provide display devices, which includes the light-emitting plate 100 of the embodiments and a liquid crystal display panel. Specifically, the liquid crystal display panel also include an array substrate, a color filter substrate, and a liquid crystal layer disposed between the array substrate and the color filter substrate.

Embodiment 2

Figure 5:
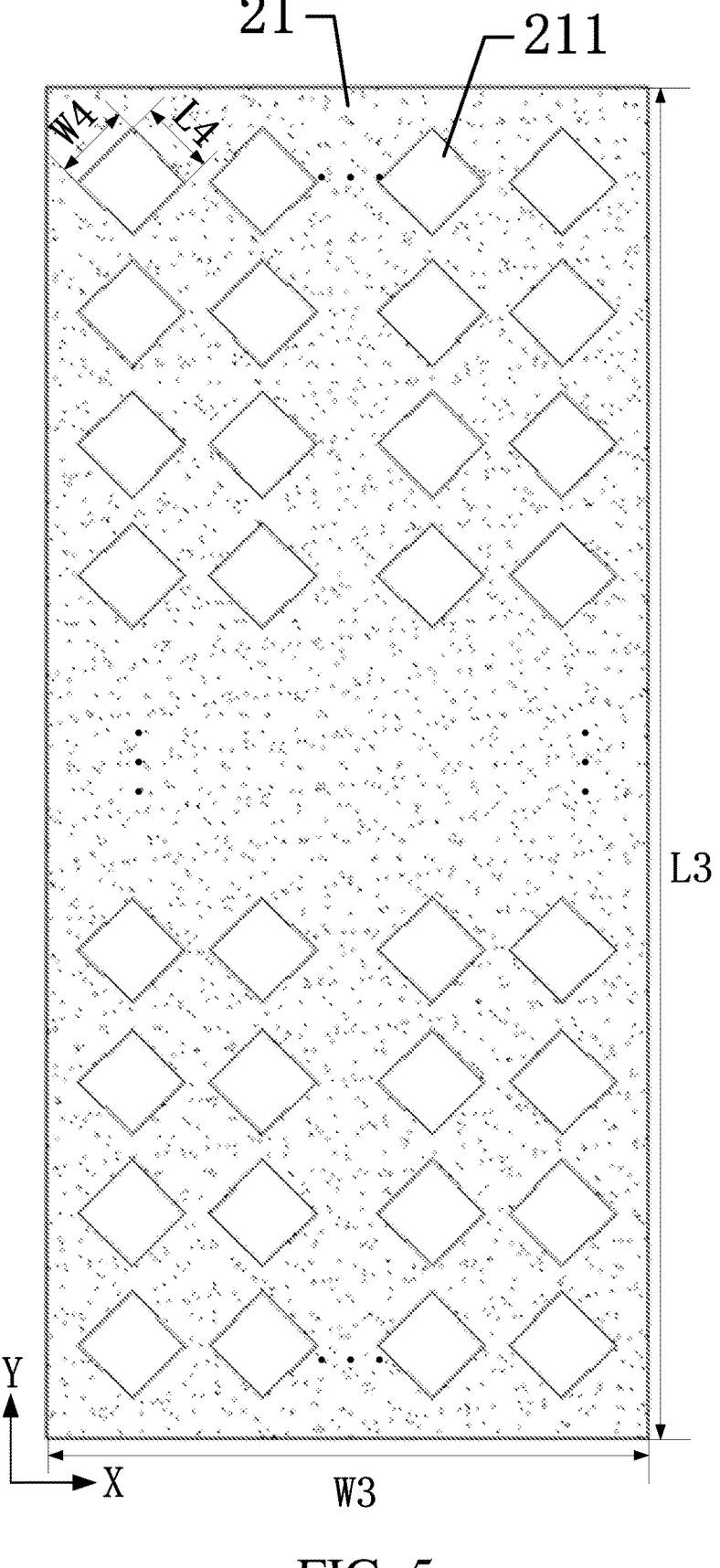
FIG. 5 is a planar schematic diagram of the metal wires of embodiment 2.

As shown in FIG. 5, difference between embodiment 1 and 2 is that: an angle between any side of the cross-section of one of the one or more vias 211 and the extending direction Y of the metal wire 21 is greater than 0 degree and less than 90 degrees. In the embodiment, the angle between any side of the cross-section of one of the one or more via 211 and the extending direction Y of the metal wire 21 is greater than 45 degrees.

That is to say, the via 211 in embodiment 1 is rotated by 45 degrees to become the via 211 in embodiment 2. Which means $L_4=L_2$ and $W_4=W_2$. A diagonal of the cross-section of one of the one or more via 211 is parallel to the extending direction Y of the metal wire 21, a coating direction of the material of the solder resist layer 5, for example, white ink, is perpendicular to the extending direction Y of the metal wire 21, the white ink is anchored by two corners arranged opposite to each other along the diagonal of the via 211, which further improves the adhesion between the solder resist layer 5 and the substrate 1.

According to the embodiment, in the driving layer 2, one or more vias 211 are defined in one or more metal wires 21 covered by the solder resist layer 5. Therefore, the solder resist layer 5 may extends into the one or more vias 211 and connected to the substrate 1, which may improve the adhesion between the solder resist layer 5 and the substrate 1, and solve the problem of peeling of the solder resist layer 5 due to the poor adhesion between the solder resist layer 5 and the substrate 1.

Embodiment 3

Figure 6:
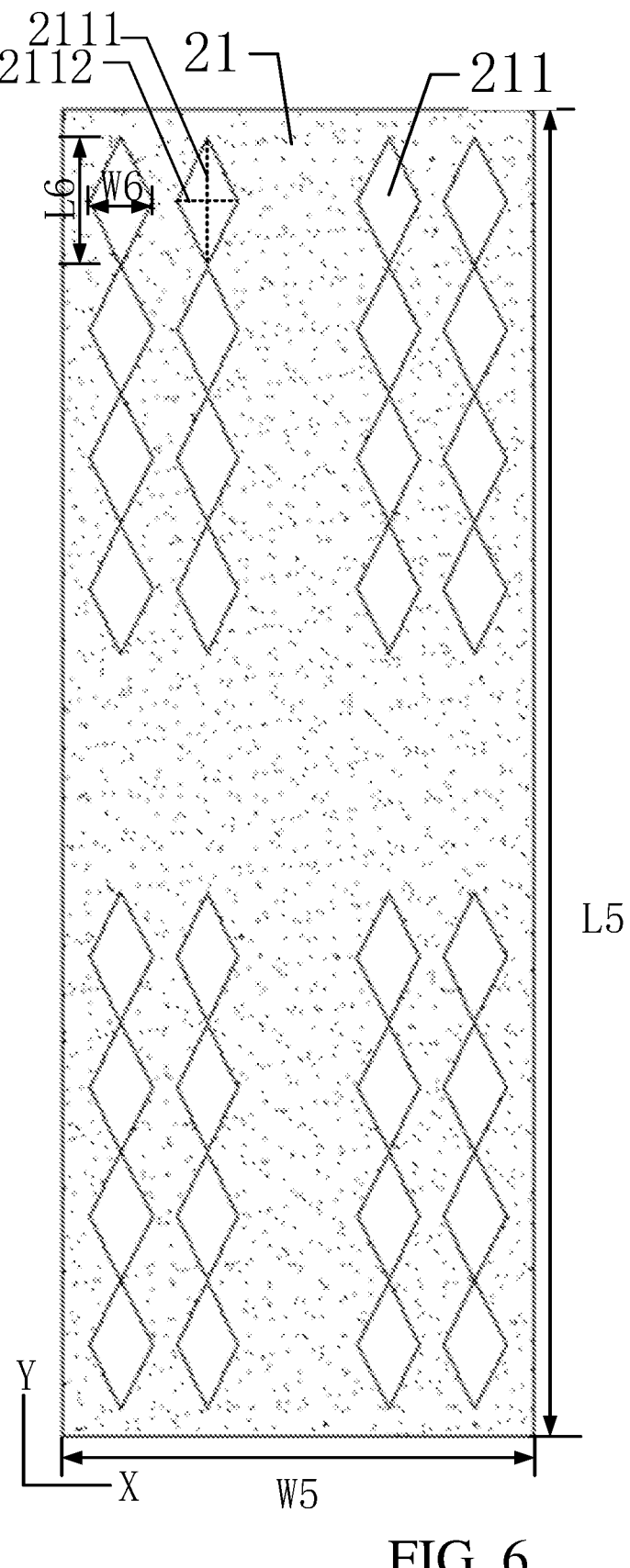
FIG. 6 is a planar schematic diagram of the metal wires of embodiment 3.

As shown in FIG. 6, difference between embodiment 3 and 2 is that: a cross-section of one of the one or more vias 211 perpendicular to the thickness direction H of the metal wire 21 is a diamond. The diamond includes a first diagonal 2111 parallel to the extension direction Y of the metal wire 21 and a second diagonal 2112 perpendicular to the first diagonal 2111, a length of the first diagonal 2111 is greater than the second diagonal 2112. When a cross-section area of one of the one or more vias 211 perpendicular to the thickness direction H of the metal wire 21 remains unchanged, that is, $W_6*L_6/2=W_4*L_4$, the greater the length $L_6$ of the first diagonal 2111 is, the less the length $W_6$ of the second diagonal 2112 is, which can reduce the width $W_5$ of the metal wire 21, and increase design margin (which means the metal wires 21 can be more flexibly arranged in a limited space), therefore, a boarder width is decreased and narrow bezel is fulfilled.

According to the embodiment, in the driving layer 2, one or more vias 211 are defined in one or more metal wires 21 covered by the solder resist layer 5. Therefore, the solder resist layer 5 may extends into the one or more vias 211 and connected to the substrate 1, which may improve the adhesion between the solder resist layer 5 and the substrate 1, and solve the problem of peeling of the solder resist layer 5 due to the poor adhesion between the solder resist layer 5 and the substrate 1.

Embodiment 4

Figure 7:
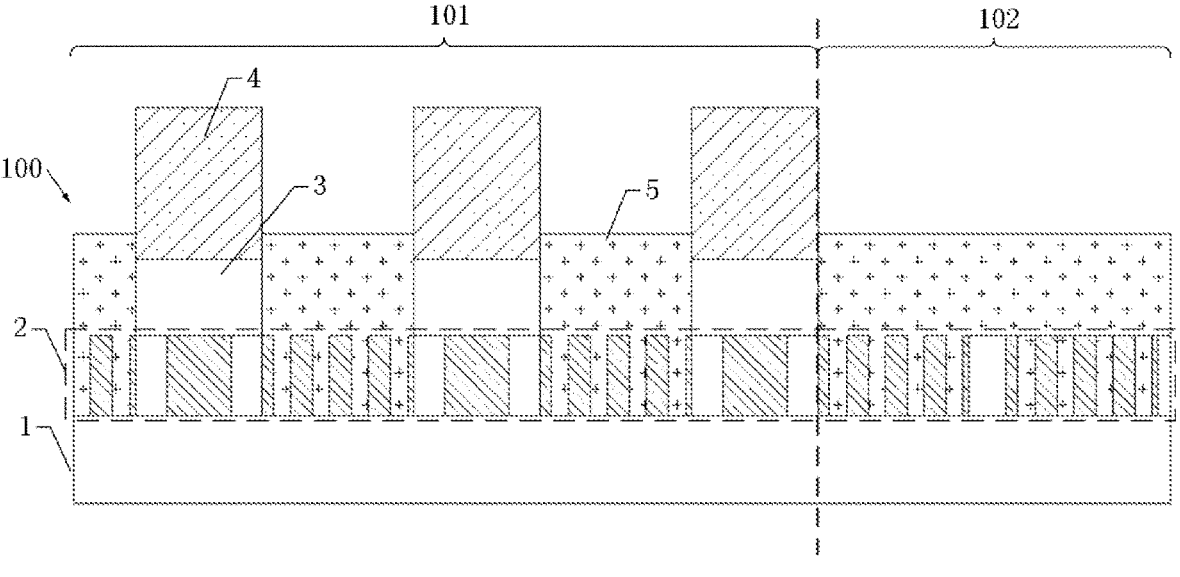
FIG. 7 is a schematic diagram of a structure of a light-emitting plate according to embodiment 4 of the present application.

As shown in FIG. 7, difference between embodiment 4 and 1 is that: the light-emitting plate 100 is a display panel, and the solder resist layer 5 includes black ink. The light-emitting plate 100 includes a display region 101 and a non-display region 102.

The solder resist layer 5 can protect the metal wires 21 in the driving layer 2 and also reduce crosstalk between adjacent two of the light-emitting elements 4 and improve contrast of the display device.

Specifically, the one or more vias 211 are defined in one or more metal wires 21 covered by the solder resist layer 5 in the driving layer 2 both in the display region 101 and the non-display region 102. Therefore, the solder resist layer 5 may extends into the one or more vias 211 and connected to the substrate 1, which may improve the adhesion between the solder resist layer 5 and the substrate 1, and solve the problem of peeling of the solder resist layer 5 due to the poor adhesion between the solder resist layer 5 and the substrate 1.

The light-emitting plate and the display device provided by the present application have been introduced in detail above, and the description of the embodiments is merely intended to help understand the method and core ideas of the present application. At the same time, according to the idea of the present application, there will be some changes in the specific implementation mode and application scope for those skilled in the art. From the above discussion, the content of this specification should not be understood as a limitation to the present application.

What is claimed is:

1. A light-emitting plate, comprising:
   a substrate;
   a driving layer disposed on the substrate and comprising a metal wire;
   a pad disposed on a side of the driving layer facing away from the substrate and connected to the driving layer;
   a light-emitting element disposed on a side of the pad facing away from the substrate and connected to the pad; and
   a solder resist layer disposed on the side of the driving layer facing away from the substrate, wherein the solder resist layer is defined with an opening configured to expose the light-emitting element;
   wherein one or more vias are defined in the metal wire and the solder resist layer extends into the one or more vias.

2. The light-emitting plate according to claim 1, wherein a ratio of a sum of cross-section area of the one or more vias in the metal wire perpendicular to a thickness direction of the metal wire to a cross-section area of the metal wire perpendicular to the thickness direction of the metal wire is greater than or equal to 30%.

3. The light-emitting plate according to claim 1, wherein a greatest length of one of the one or more vias in an extending direction of the metal wire is greater than or equal to a greatest length of the one of the one or more vias in a direction perpendicular to the extending direction of the metal wire.

4. The light-emitting plate according to claim 1, wherein a cross-section of one of the one or more vias perpendicular to a thickness direction of the metal wire is a rectangle, the cross-section of the one of the one or more vias comprises a first side parallel to an extension direction of the metal wire and a second side perpendicular to the first side, and a length of the first side is greater than or equal to a length of the second side.

5. The light-emitting plate according to claim 1, wherein a cross-section of one of the one or more vias perpendicular to a thickness direction of the metal wire is a diamond, the diamond comprises a first diagonal parallel to an extension direction of the metal wire and a second diagonal perpendicular to the first diagonal, a length of the first diagonal is greater than the second diagonal.

6. The light-emitting plate according to claim 1, wherein a cross-section of one of the one or more vias perpendicular to a thickness direction of the metal wire is a rectangle, and an angle between any side of the cross-section of the one of the one or more vias and an extending direction of the metal wire is greater than 0 degree and less than 90 degrees.

7. The light-emitting plate according to claim 1, wherein a cross-section of one of the one or more vias perpendicular to a thickness direction of the metal wire is a quadrilateral, and a diagonal of the quadrilateral is parallel to an extending direction of the metal wire.

8. The light-emitting plate according to claim 1, wherein a cross-section of one of the one or more vias perpendicular to a thickness direction of the metal wire is selected from one of triangle, circle, rectangle, or diamond.

9. The light-emitting plate according to claim 1, wherein the light-emitting plate is a display panel, and the solder resist layer comprises black ink; or the light-emitting plate is a backlight plate, and the solder resist layer comprises white ink.

10. The light-emitting plate according to claim 1, wherein one of the one or more vias is defined as a through-hole, the substrate is exposed from the through-hole, and the solder resist layer is connected to the substrate.

11. The light-emitting plate according to claim 1, wherein a width of a first portion of the metal wire defined with the one or more vias is greater than a width of a second portion of the metal wire without vias.

12. The light-emitting plate according to claim 11, wherein the width of the second portion of the metal wire without vias is equal to an active width calculated by subtracting a sum of the widths of the one or more vias from the width of the first portion of the metal wire defined with the one of the one or more vias.

13. A display device, comprising the light-emitting plate according to claim 1, wherein the light-emitting plate is a backlight plate, and the display device further comprises a liquid crystal display panel.

14. The display device according to claim 13, wherein a ratio of a sum of cross-section area of the one or more vias in the metal wire perpendicular to a thickness direction of the metal wire to a cross-section area of the metal wire perpendicular to the thickness direction of the metal wire is greater than or equal to 30%.

15. The display device according to claim 13, wherein a greatest length of one of the one or more vias in an extending direction of the metal wire is greater than or equal to a greatest length of the one of the one or more vias in a direction perpendicular to the extending direction of the metal wire.

16. The display device according to claim 13, wherein a cross-section of one of the one or more vias perpendicular to a thickness direction of the metal wire is a rectangle, the cross-section of the one of the one or more vias comprises a first side parallel to an extension direction of the metal wire and a second side perpendicular to the first side, and a length of the first side is greater than or equal to a length of the second side.

17. The display device according to claim 13, wherein a cross-section of one of the one or more vias perpendicular to a thickness direction of the metal wire is a diamond, the diamond comprises a first diagonal parallel to an extension direction of the metal wire and a second diagonal perpendicular to the first diagonal, a length of the first diagonal is greater than the second diagonal.

18. The display device according to claim 13, wherein a cross-section of one of the one or more vias perpendicular to a thickness direction of the metal wire is a rectangle, and an angle between any side of the cross-section of the one of the one or more vias and an extending direction of the metal wire is greater than 0 degree and less than 90 degrees.

19. The display device according to claim 13, wherein a cross-section of one of the one or more vias perpendicular to a thickness direction of the metal wire is a quadrilateral, and a diagonal of the quadrilateral is parallel to an extending direction of the metal wire.

20. The display device according to claim 13, wherein a width of a first portion of the metal wire defined with the one or more vias is greater than a width of a second portion of the metal wire without vias.

\* \* \* \* \*